(12) United States Patent
Hsu et al.

(10) Patent No.: US 8,178,407 B2
(45) Date of Patent: May 15, 2012

(54) SYSTEMS AND METHODS FOR A HIGH DENSITY, COMPACT MEMORY ARRAY

(75) Inventors: Tzu-Hsuan Hsu, Chiayi (TW); Ming-Hsiu Lee, Hsinchu (TW); Chao-I Wu, Tainan (TW); Ming-Chang Kuo, Changhua (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 12/561,395

(22) Filed: Sep. 17, 2009

(65) Prior Publication Data

US 2010/0009504 A1 Jan. 14, 2010

Related U.S. Application Data

(62) Division of application No. 11/327,792, filed on Jan. 6, 2006, now Pat. No. 7,608,886.

(51) Int. Cl.
*H01L 21/336* (2006.01)
(52) U.S. Cl. .. 438/259; 438/262; 257/314; 257/E21.679
(58) Field of Classification Search ............ 257/314, 257/E21.679; 438/259
See application file for complete search history.

(56) References Cited

U.S. PATENT DOCUMENTS

| | | | |
|---|---|---|---|
| 5,049,956 A | 9/1991 | Yoshida et al. | |
| 5,973,356 A | 10/1999 | Noble et al. | |
| 6,143,636 A | 11/2000 | Forbes et al. | |
| 6,486,028 B1 | 11/2002 | Chang et al. | |
| 7,301,804 B2 | 11/2007 | Prall et al. | |
| 2003/0139011 A1* | 7/2003 | Cleeves et al. | 438/257 |
| 2004/0066672 A1 | 4/2004 | Forbes | |
| 2004/0232471 A1* | 11/2004 | Shukuri | 257/314 |
| 2005/0128804 A1 | 6/2005 | Forbes | |
| 2005/0285177 A1* | 12/2005 | Shone | 257/315 |

OTHER PUBLICATIONS

Sze, Physics of Semiconductor Devices, 1981, John Wiley, Second edition, p. 852.*

* cited by examiner

*Primary Examiner* — Jerome Jackson, Jr.
*Assistant Examiner* — Paul Budd
(74) *Attorney, Agent, or Firm* — Baker & McKenzie LLP

(57) ABSTRACT

A memory array comprising vertical memory cells does not require any isolation layers between cells. Thus, a very compact, high density memory array can be achieved. Each memory cell in the memory array is configured to store 4 bits of data per cell. Multi-level charge techniques can be used to increase the number of bit per cell and achieve further increased density for the memory array.

14 Claims, 13 Drawing Sheets

SYSTEMS AND METHODS FOR A HIGH DENSITY, COMPACT MEMORY ARRAY

RELATED APPLICATION

This application is a Divisional Application of U.S. patent application Ser. No. 11/327,792, entitled "Systems and Methods for a High Density, Compact Memory Array" filed Jan. 6, 2006, which is herein incorporated by reference in its entirety for all purposes.

FIELD OF THE INVENTION

The invention relates in general to memory devices, and in particular to multi-bits per cell memory arrays that provide high density and compactness.

BACKGROUND OF THE INVENTION

Flash based electrically erasable and programmable read only memories (EEPROMS) are re-programmable, non-volatile memories that have become ubiquitous in a variety of computer systems for storing data. These computer systems can include traditional desktop and laptop computer systems, as well as portable computer systems, such as cellular telephones, Personal Digital Assistance (PDAs), and other portable communication systems. The typical data storage element of an EEPROM is a floating gate transistor, such as a field effect transistor (FET) having an electrically isolated, or floating gate that controls electrical conduction between source and drain regions. Data is represented by charges stored on the floating gate and the resulting conductivity obtained between source and drain regions.

The requirements of conventional flash memory devices, both with regard to physical size and density continuously grow more stringent. There is also continued pressure to lower the costs of conventional flash memory devices. It has been shown that as the density of conventional flash memory devices increases, and/or as the cost of conventional flash memory devices is reduced, the market for conventional flash memory devices grows. For example, as the price of conventional price memory devices goes down, new applications for flash memory devices emerged. The increase demand caused by increased density and lower prices further drives requirements for smaller, more dense, and less expensive flash memory devices.

Conventionally, cost reduction and density increase for flash memory devices have been achieved through process scaling in the same manner as other types of semi-conductor memory devices. In other words, as the ability of semi-conductor manufacturing process equipment improves, smaller features can be resolved on a silicon wafers resulting in a smaller memory cell and thus more bit in a given amount of silicon area. More bits in a given silicon area result in higher density memories and lower costs per bit. Using the technique of process technology scaling, conventional flash memory device cell size has been reduced significantly over the past 10 to 20 years.

Process scaling typically affects the size of the transistor comprising a memory cell. Specifically, scaling often reduces the gate and the channel lengths for the cell transistor. A point is reached, however, where the gate and the channel lengths cannot be reduced beyond a critical value without increasing the parasitic source/drain junction capacitance of the device, which results in adverse effects, referred to as short channel effects. Short channel effects can include hot carrier damage and the possibility of punch through between the source and drain regions, which would have an adverse effect on the device performance. Thus, process scaling has limits in terms of the increase in density that can be achieved. Moreover, increase scaling can have an adverse effect on devise performance.

One way to improve device performance is to reduce the junction capacitance for the cell transistor. To reduce the junction capacitance, the channel length has to be large enough to avoid short channel effects but clearly, a larger channel length would limit the size reduction, or scaling, that can be achieved for the cell transistor. As a result, scaling and device performance objectives are often at odds. These competing objectives further limit the benefits that can be achieved by scaling.

Multi-Level Charge (MLC) techniques have been devised that can further increase density gains and size reductions beyond that which can be achieved using scaling. MLC techniques take advantage of the ability to store multiple charge levels in the floating gate of a transistor cell. Each of these different levels can then be used to represent multiple bits within the cell. Thus, each cell can store more bits which increases the density and reduces the physical size.

Still, conventional applications for flash-based memory devices require further increases in density and reductions in size and cost. New techniques must be developed to address the requirements of the increasing number of new applications.

SUMMARY

A memory array comprising vertical memory cells does not require any isolation layers between cells. Thus, a very compact, high density memory array can be achieved.

In one aspect, each memory cell in the memory array is configured to store 4 bits of data per cell.

In another aspect, multi-level charge techniques can be used to increase the number of bit per cell and achieve further increased density for the memory array.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

The following description details embodiments of a densely packed flash memory cell array comprising vertical memory cells that can be configured to store four bits per cell. In other words, the cell transistors are formed as vertical structures. This means that the transistor channel is also disposed in a vertical direction. As a result, the channel length can be adjusted, as described below, in order to achieve a desired junction capacitance and associated device performance enhancement. This enhancement can be achieved without significant increases in the overall size of the device and without effect on the density of the memory array.

Figure 1:
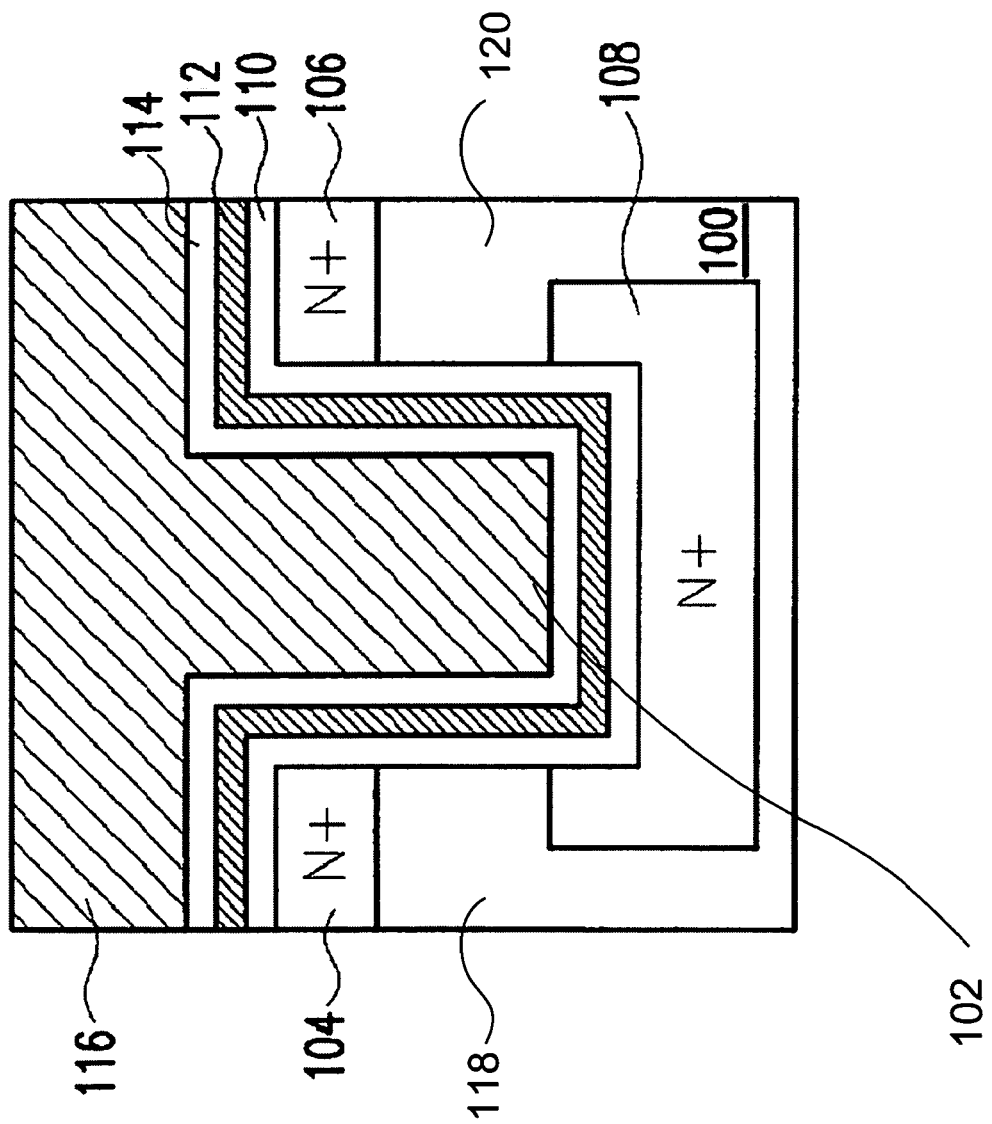
FIG. 1 is a diagram illustrating an exemplary vertical memory cell.
Figure 6:
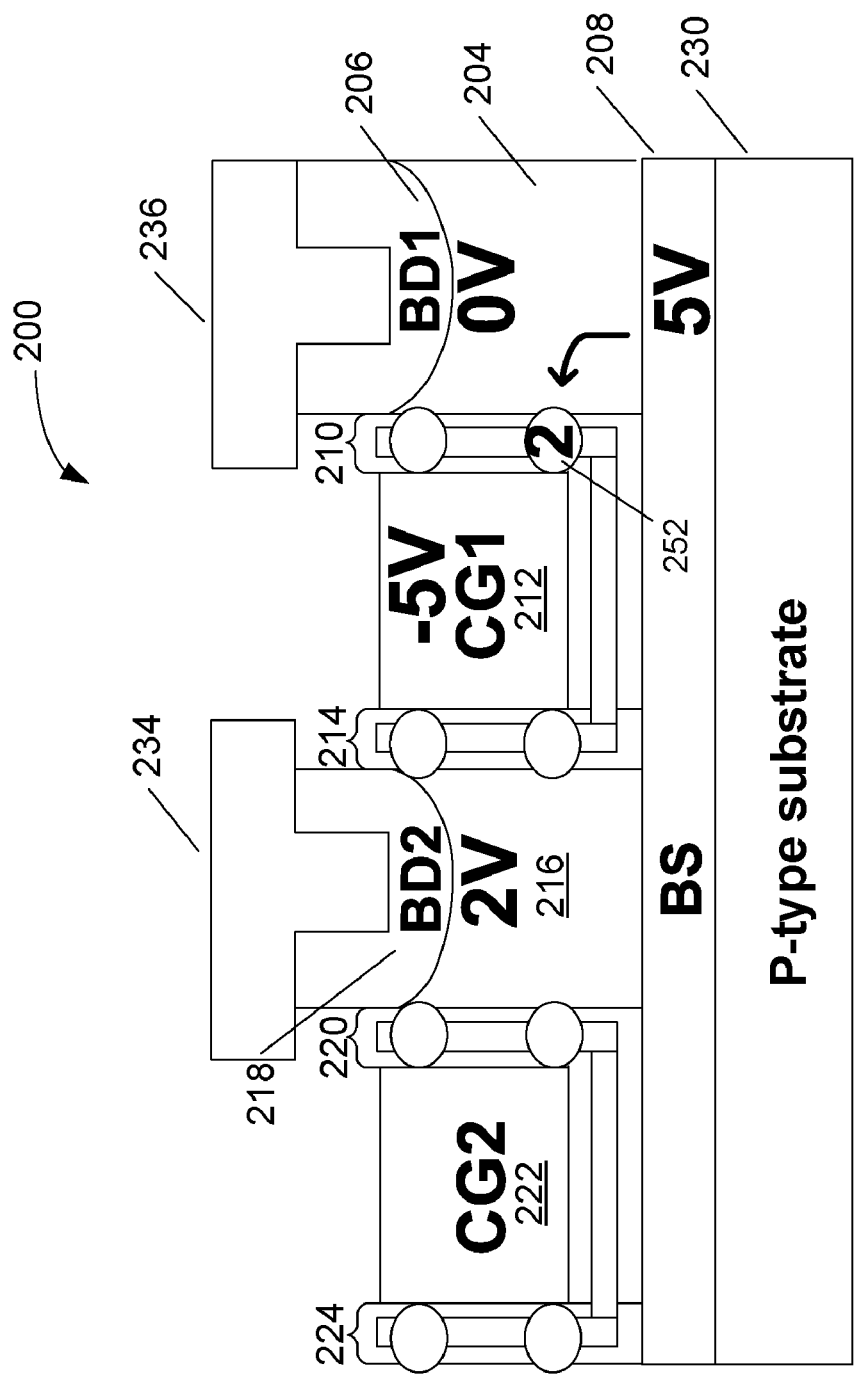
FIG. 6 is a diagram illustrating an example method for erasing a second bit in a first transistor structure of the array of FIG. 2.

U.S. Pat. No. 6,486,028, which is co-owned by the assignee of the present application, describes a vertical flash memory cell. FIG. 6 of U.S. Pat. No. 6,486,028 is reproduced herein as FIG. 1. FIG. 1 herein will be used to describe the construction for an exemplary vertical cell structure. Referring to FIG. 1, a semiconductor substrate 100 can be provided. A trench 102 can then be formed in semiconductor substrate 100, e.g., using a conventional photolithography and etching process. An ion implantation can then be performed in order to form a first source/drain region 104, and a second source/drain region 106 within substrate 100 as illustrated in FIG. 1. Ion implantation can also be performed in order to form a common source/drain region 108 within substrate 100 as illustrated. For example, the source/drain regions 104, 106 and 108 can be formed using implantations of boron fluoride, arsenic, or phosphorus ions with doses and energy levels that are well known for conventional implantation processes.

A trapping, or dielectric layer can then be formed over substrate 100 and trench 102. The trapping layer can, for example, comprise an oxide-nitride-oxide (ONO) layer comprising a silicon nitride layer 112 sandwiched between two silicon oxide layers 110 and 114. A gate conducting layer 116 can then be formed over substrate 100 and filling trench 102 above the ONO layer as illustrated.

Thus, the cell illustrated in FIG. 1 comprises dual transistor structures. Gate conducting layer 116 acts as the gate for both transistor structures. The rest of the first transistor structure is then formed from the area of the ONO layer above body 118 in which a channel is formed, under the right conditions, between source/drain region 104 and common source/drain region 108. The remainder of the second transistor structure is then formed by the area of ONO layer under gate conducting layer 116 and over body 120 formed from silicon substrate 100. A channel is then formed under the right conditions in body 120 between source/drain region 106 and common source/drain region 108.

Charges can then be trapped in nitride layer 112 of both transistor structures when the appropriate programming voltages are applied to gate conducting layer 116, source/drain regions 104 and 106, and common source/drain region 108. In one embodiment, each transistor structure can be configured to store two bits. Thus, the cell illustrated in FIG. 1 can be configured to store four bits of information altogether.

U.S. Pat. No. 6,486,028 describes in detail example processes that can be used to form the structure illustrated in FIG. 1. While these processes are not described in detail here, U.S. Pat. No. 6,486,028 is incorporated herein in its entirety as if disclosed in full, and can be referred to for specifics related to the example processes.

Figure 2:
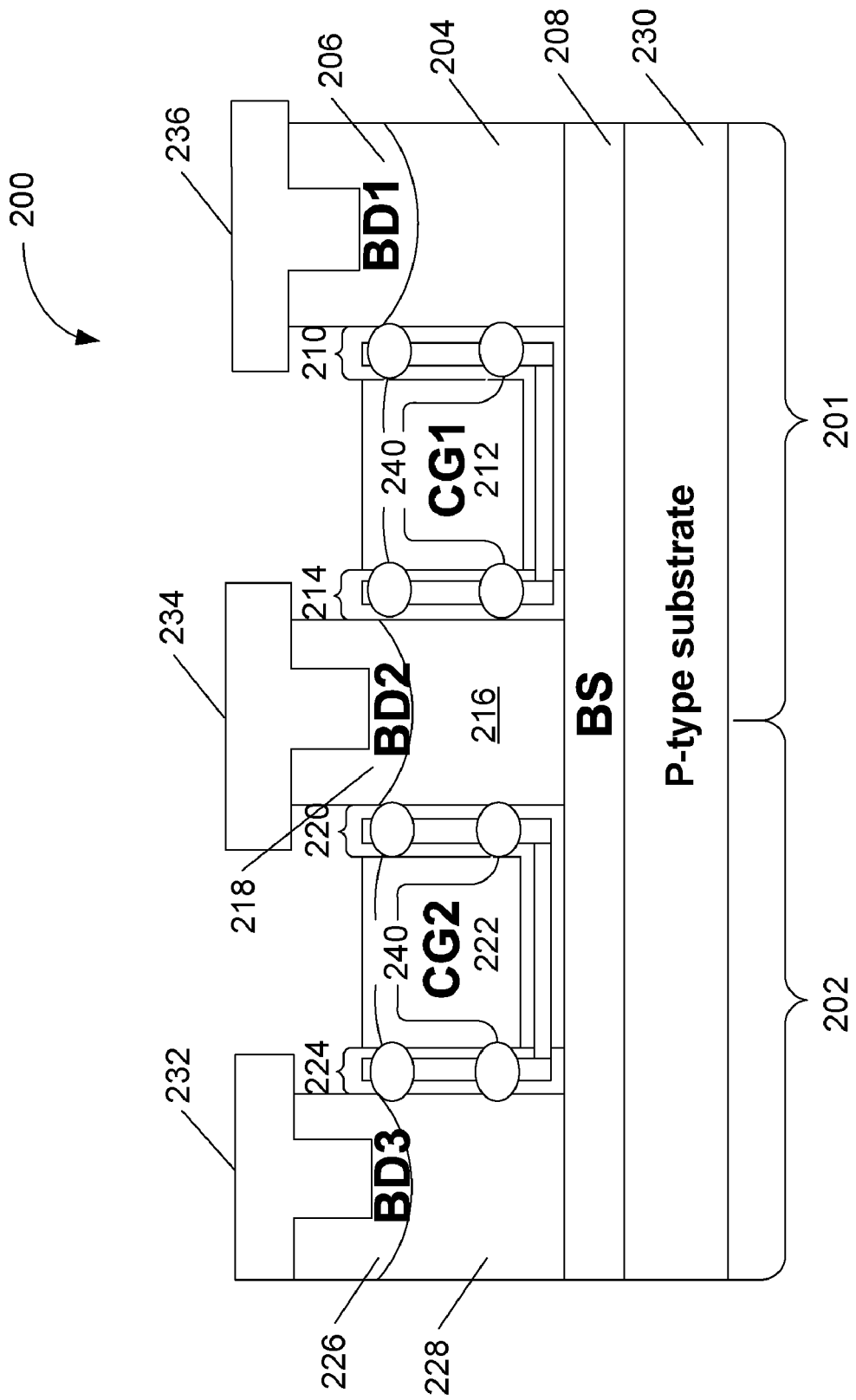
FIG. 2 is a diagram illustrating an example memory array comprising vertical cells in accordance with one embodiment.

FIG. 2 illustrates an example memory array comprising vertical structures, such as those described in relation to FIG. 1. As with the structure described in relation to FIG. 1, the cells comprising memory array 200 can be used to store four bits per cell which results in a compact, high density memory array. The cells used to construct memory array 200 are not necessarily identical to the cell described in relation to FIG. 1. Therefore, differences between the cells used to construct memory array 200 and the cell described in relation to FIG. 1 may be apparent in the description that follows. It will be understood, however, that such differences can be implantation specific. Further, memory array 200 is illustrated as comprising two cells 202 and 201, respectively. It will be understood, however, that the systems and methods described herein can apply to memory arrays comprising any number of cells and that the illustration of two cells in FIG. 2 is by way of example only. Accordingly, the embodiment of FIG. 2 should not be seen as limiting the systems and methods described herein to arrays comprising any particular number of cells.

Each cell 202 and 201, comprises two vertical transistor structures each configured to store two bits 240 of data. Thus, each cell is a four-bit cell as illustrated. Each of the transistor structures is a SONOS structure formed on p-type substrate 230. Thus, cell 201 comprises a first transistor structure constructed from polysilicon gate region 212 which is separated from body region 204 by ONO layer 210. The first transistor structure also comprises a drain region 206 and source region formed under source line 208 implanted in p-type substraight 230. Cell 201 also comprises a second transistor structure comprising control gate region 212 separated from body region 216 by ONO layer 214. The second transistor structure also comprises drain region 218 and a source region formed under source line 208 as illustrated.

Cell 202 also comprises two vertical transistor structures, the first of these structures being constructed from control gate layer 222 separated from body region 216 by ONO layer 220. The first transistor structure of cell 202 also comprises drain region 218 and a source region under source line 208. Thus, it can be seen, that the first transistor structure of cell 202 and the second transistor structure of cell 201 make use of the same drain region 218, body 216, source region and source line 208. This is in contrast to conventional memory arrays which typically include an isolation layer between cells in the memory array. Because memory array 200 does not require such isolation structures, higher density and more compact arrays can be achieved using the systems and methods described herein.

The second transistor structure of cell 202 comprises control gate region 222 separated from body region 228 by ONO layer 224. The second transistor structure further comprises drain region 226 and a source region under source line 208 as illustrated.

FIGS. 3-8 illustrate example method for programming, erasing, and reading cells in memory array 200. While the examples of FIGS. 3-8 relate to specific schemes for programming, erasing, and reading memory array 200, it will be understood that other and/or future schemes can also be applied to memory array 200.

Figure 3:
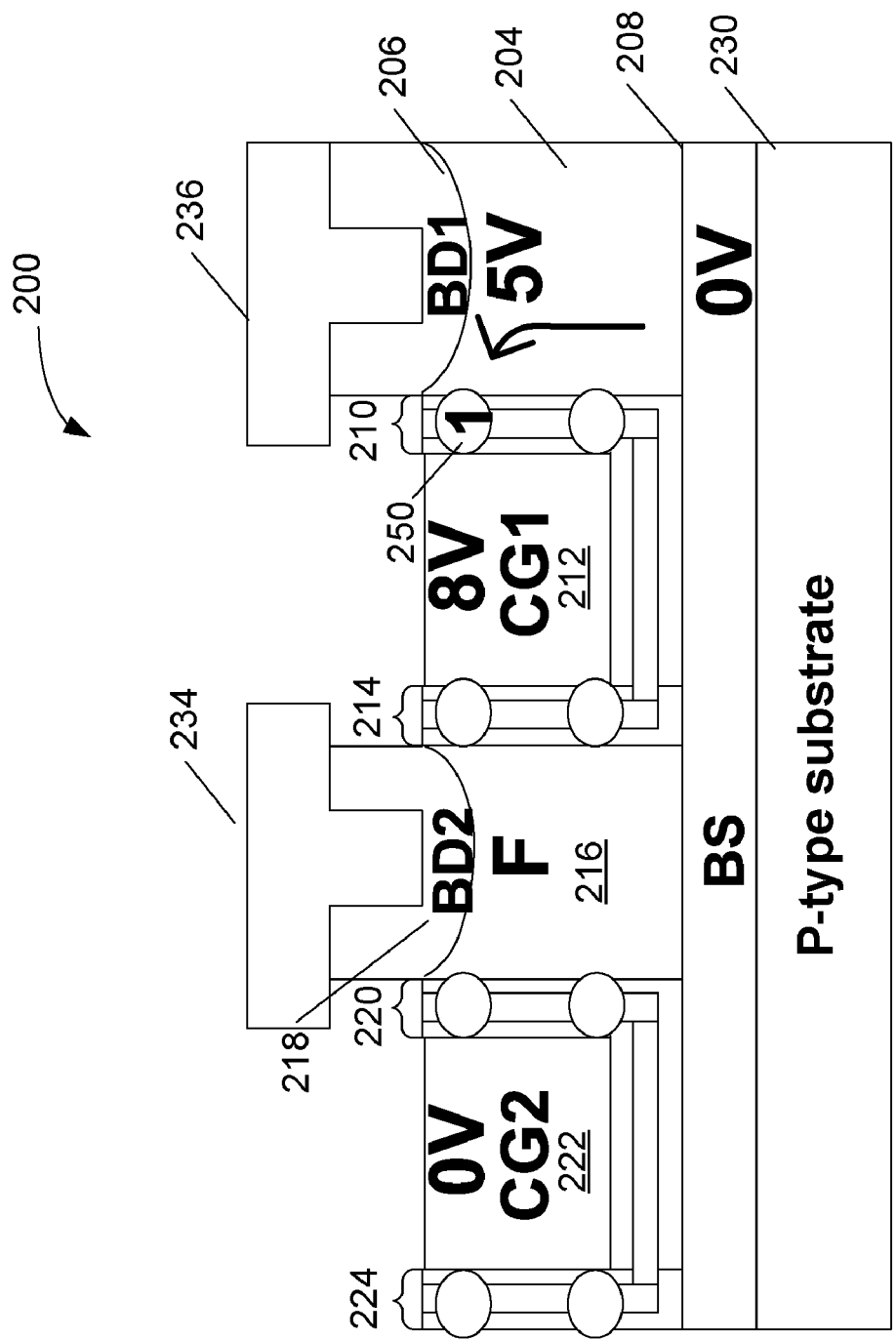
FIG. 3 is a diagram illustrating an example method for programming a bit in a first transistor structure of the array of FIG. 2.

Referring to FIG. 3, an example method for programming a first bit represented by charge 250 using a channel hot electron technique is described. In the example of FIG. 3, an 8-volt programming voltage is applied to control gate region 212, while a 5-volt programming voltage is applied to drain region 206 via drain contact 236. The source region is tied to ground, or zero volts, as is body region 204. At the same time, control gate region 222 is also tied to zero volts as is body region 216. Drain region 218 and the source region for the unselected cell are then allowed to float. The programming voltages applied to control gate region 212, drain region 206, body region 204, and source line 202 cause a channel to form in body 204 under ONO region 210 and charge to accumulate in the nitride layer of ONO layer 210 as illustrated. The accumulated charge 250 causes the threshold for the transistor structure to change. This change in threshold voltage can then be detected during a read operation. The voltages described above are both approximate and by way of example only. Thus, the voltages described should not be seen as limiting the methods described herein to any particular voltages, and it will be apparent that other voltages can be used depending on the implementation.

Figure 4:
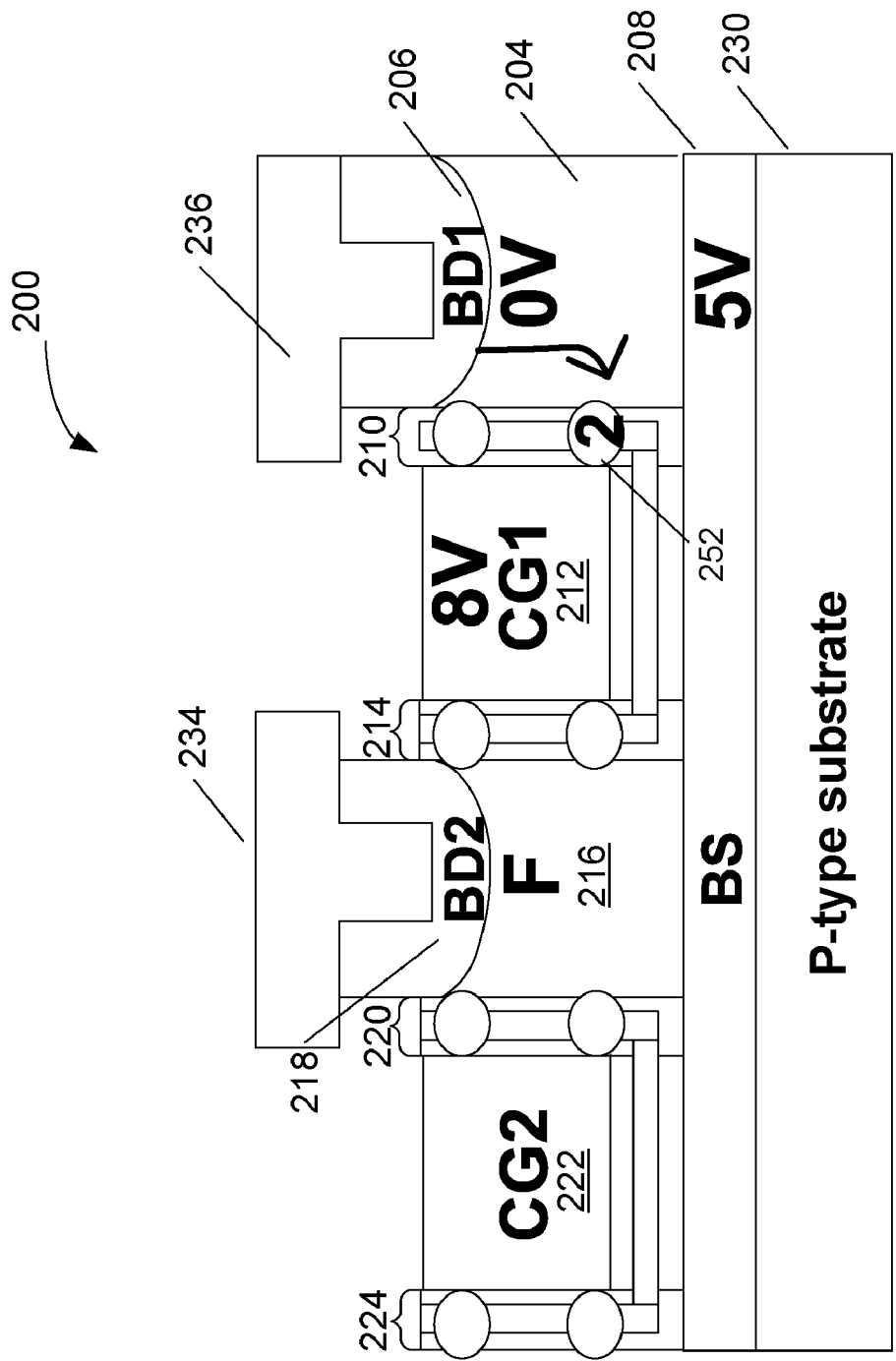
FIG. 4 is a diagram illustrating an example method for programming a second bit in a first transistor structure of the array of FIG. 2.

FIG. 4 illustrates an example process for programming a second bit of data, represented by charge 252, in accordance with the systems and methods described herein. In the example of FIG. 4, a channel hot electron scheme is again used to store charge 252. Again, however, it will be understood that other schemes can be used to store charge 250 and 252 in accordance with the systems and methods described herein.

First, a programming voltage of 8-volt is applied to control gate region 212 and a 5-volt programming voltage is applied to the source region 208. Drain region 206 is then tied to 0-volts as is body region 204. At the same time, control gate region 222 is tied to 0-volts while drain region 218 is allowed to float. Body region 216 is tied to 0-volts, while the source region for the unselected array is allowed to float. The programming voltages applied to control gate region 212, drain region 206, body 204, and source region 208 cause a channel to form in body 204, between drain region 206 and source region 208. The channel hot electron effect then causes electrons to be trapped in the nitride layer of ONO layer 210, thus forming in charge 252. The voltages described above are both approximate and by way of example only. Thus, the voltages described should not be seen as limiting the methods described herein to any particular voltages, and it will be apparent that other voltages can be used depending on the implementation.

Similar voltages can then be applied to the associated control gate regions, drain regions, body regions and source regions, in order to store the remaining charges within memory cell 200 as required.

It should be noted that while specific programming voltages are shown in relation to the examples of FIGS. 3 and 4, it will be clear that these specific voltages are by way of example only. Thus, the examples provided in relation to FIGS. 3 and 4 should not be seen as limiting the systems and methods described herein to any particular programming voltages and it should be clear that other programming voltages can be used with the systems and methods described herein.

Figure 5:
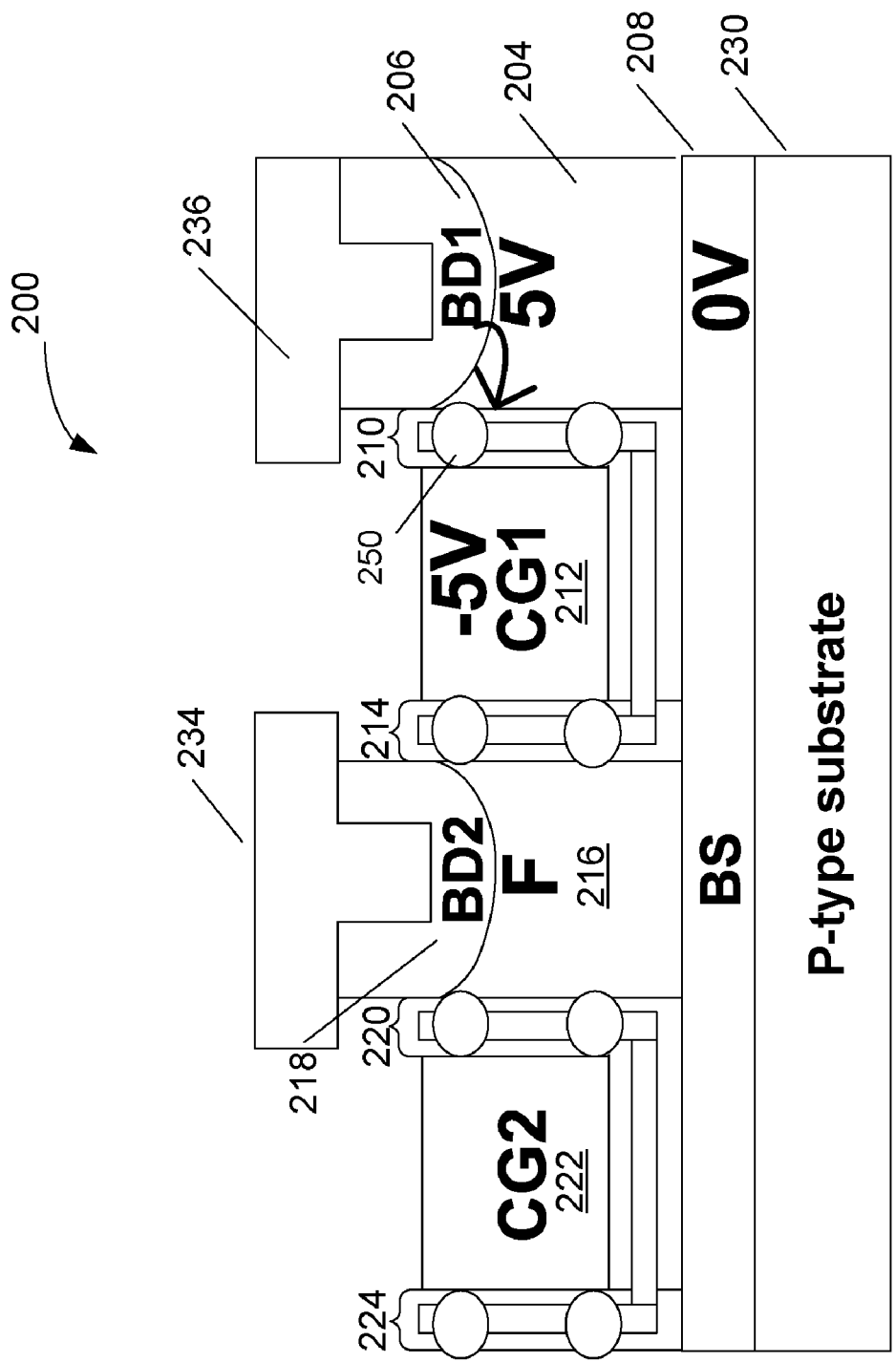
FIG. 5 is a diagram illustrating an example method for erasing a bit in a first transistor structure of the array of FIG. 2.

FIG. 5 illustrates an erase operation from memory cell 200 that uses a band-to-band hot hole technique. Thus, charge 250 can be removed by tying control gate region 212 to −5-volts while tying drain region 206 to +5-volt. The source region and body region 204 are tied to 0-volt during the erase operation. Control gate region 222 is tied to 0-volt as is body region 216, while drain region 218 is allowed to float and the source region for the unselected cell is tied 2-volts. The voltages described above are both approximate and by way of example only. Thus, the voltages described should not be seen as limiting the methods described herein to any particular voltages, and it will be apparent that other voltages can be used depending on the implementation.

In FIGS. 6, a band-to-band hot hole technique can be used to remove charge 252 by again tying control gate region 212 to −5-volts while applying +5-volts to the source region. Drain region 206 and body region 204 can then be tied to 0-volts. For the unselected cell, control gate region 222 can be tied to 0-volts while drain region 218 is tied to 2-volts. The unselected source region and body region 216 can then also be tied to 0-volts, while charge 252 is removed. Again, the voltages described above are both approximate and by way of example only. Thus, the voltages described should not be seen as limiting the methods described herein to any particular voltages, and it will be apparent that other voltages can be used depending on the implementation.

Figure 7:
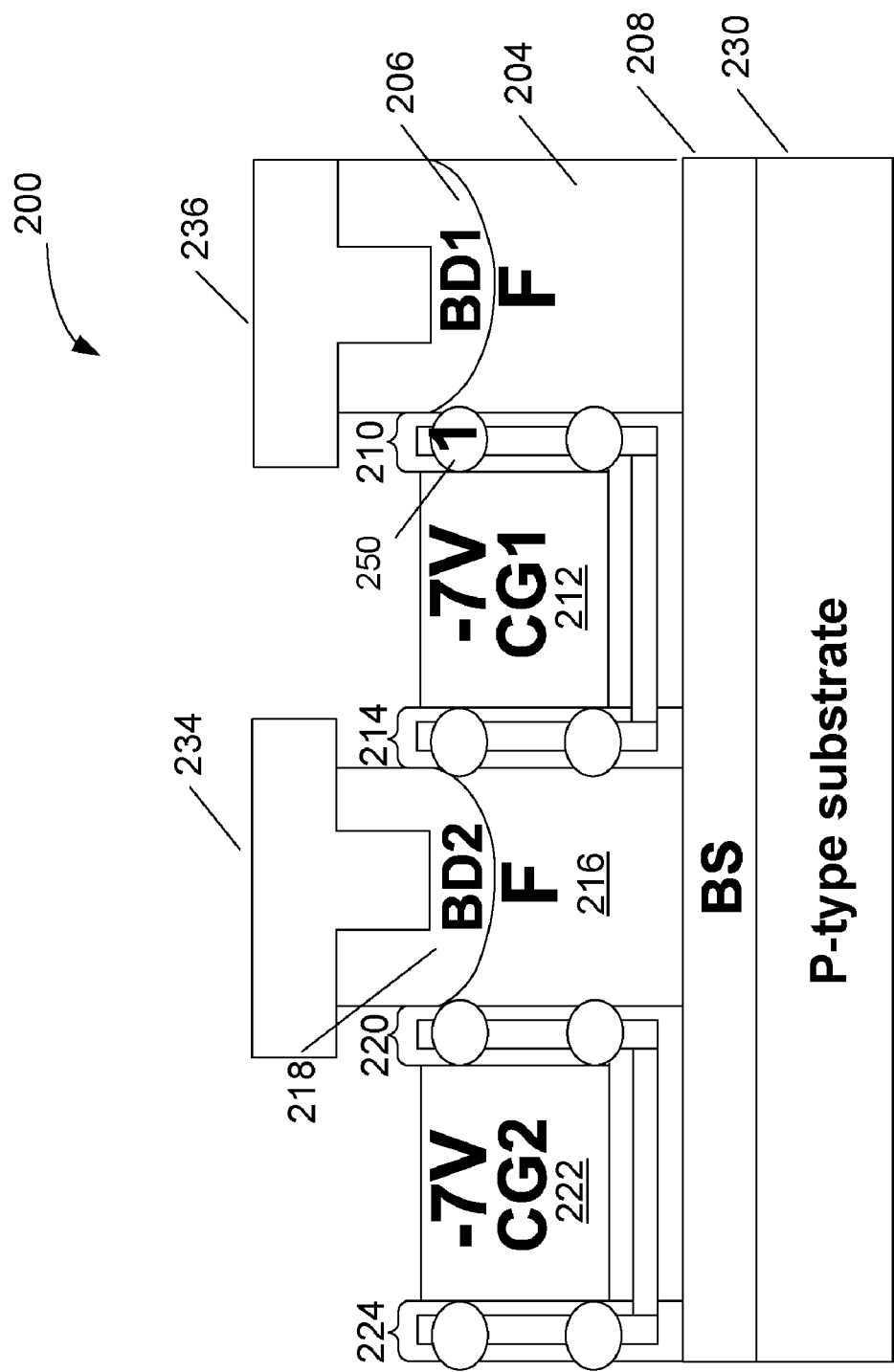
FIG. 7 is a diagram illustrating an example method for block erasing the array of FIG. 2.

FIG. 7 illustrate an alternative erase operation that uses a Fowler-Nordheim Technique. The Fowler-Nordheim Technique illustrated in FIG. 7 can be used for block erase operations. Thus, control gate regions 222 and 212 can be tied to −7-volt, while body regions 216 and 204 are tied to a +7-volts. Drain regions 218 and 206 as well as the source regions can then be allowed to float in order to remove charges during a block erase. Again, the voltages described above are both approximate and by way of example only. Thus, the voltages described should not be seen as limiting the methods described herein to any particular voltages, and it will be apparent that other voltages can be used depending on the implementation.

Figure 8:
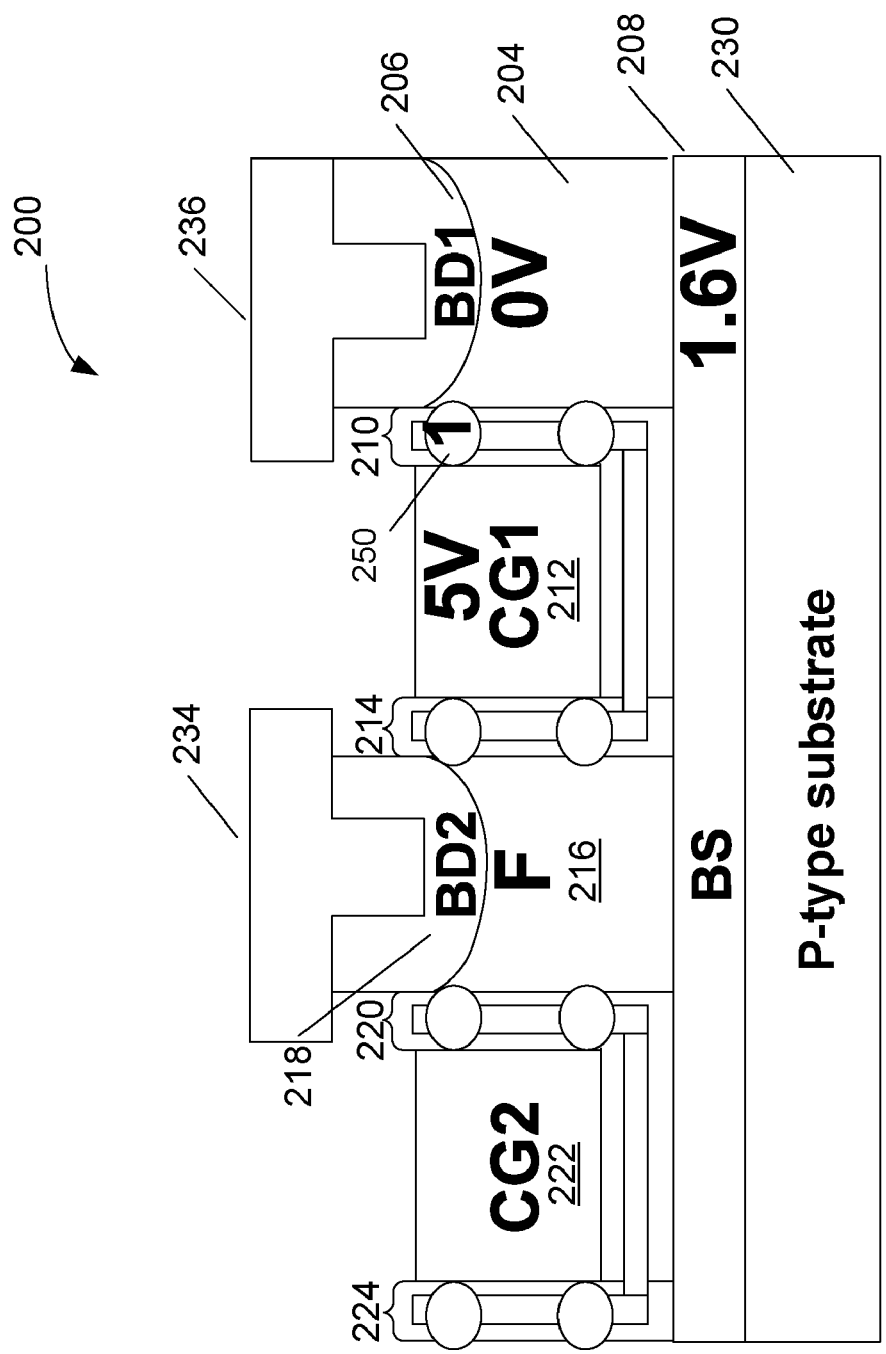
FIG. 8 is a diagram illustrating an example method for reading a bit in a first transistor structure of the array of FIG. 2.

FIG. 8 illustrates an example read operation in relation to charge, or bit 250. Thus, in order to read bit 250 a 5-volt read voltage can be applied to control gate region 212 while a 1.6-volt read voltage is applied to the source region. Drain region 206 and body 204 can then be tied to 0-volts. Control gate region 222 of the unselected cell can also be tied to 0-volt as can body region 216, while drain region 218 and the source region for the unselected cell can be allowed to float. Application of the voltages described will then result in current flow through the vertical transistor structure depending on the threshold voltage created by charge 250. This current can then be sampled in order to determine whether a charge 250 is present. Similar read voltages can then be applied in order to detect the remaining bits within memory array 200. Again, the voltages described above are both approximate and by way of example only. Thus, the voltages described should not be seen as limiting the methods described herein to any particular voltages, and it will be apparent that other voltages can be used depending on the implementation.

Again, it will be clear that the voltages described in relation to FIGS. 3-8 are by way of example only and that the systems and methods described herein should not be seen as being limited to any specific program, erase, and/or read voltages.

Figure 9A:
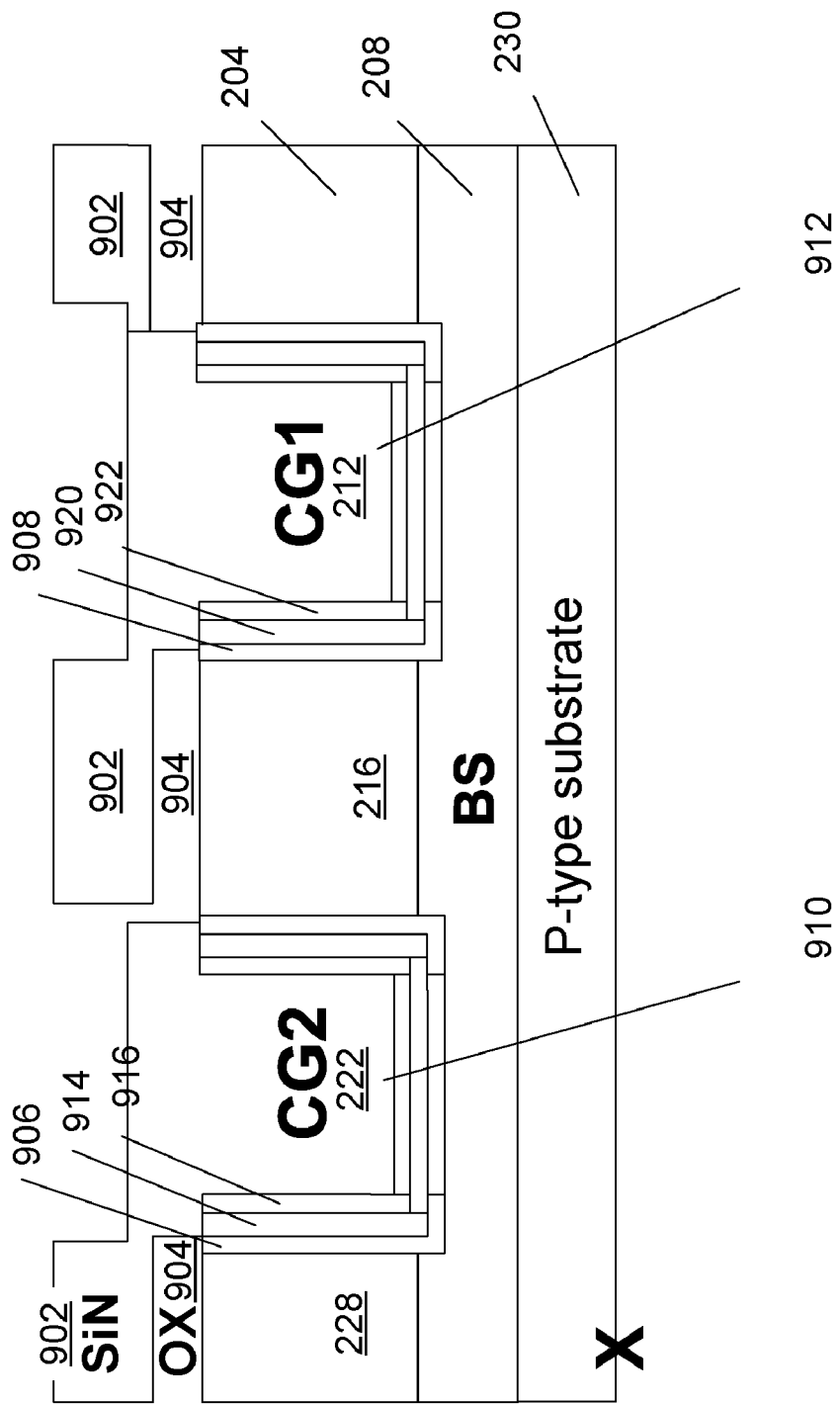
FIGS. 9A-9D are diagrams illustrating an example process for fabricating the array of FIG. 2 in accordance with one embodiment.

FIG. 9A-9D will be used to describe an example process flow for constructing memory array 200 in accordance with one embodiment of the systems and methods describe herein. In FIGS. 9A-9D, reference numbers for areas referred to in FIGS. 1-8 have been maintained. As can be seen in FIG. 9A, memory array 200 can be constructed using a p-type substrate 230. A photo resist can then be used to define and implantation mask for source line 208. Source line 208 can then be implanted using well-known implantation techniques, such as those described in U.S. Pat. No. 6,486,028. Next, oxide layers 904 and silicon nitride layers 902 can be deposited on top of body regions 204, 216, and 228 as shown. Photo resist can then be used to define a mask for the word line trench and etching. Thus, the word line trench and etching mask can be used to form trenches 910 and 912 within substrate 230 as illustrated.

Trenches 910 and 912 can then be lined with a dielectric layer, e.g. comprising oxide layers 906 and 908, silicon nitride layers 914 and 920, and oxide layers 916 and 922, respectively. Trenches 910 and 912 can then be filed with gate polysilicon layers 212 and 222. A conventional etching back process can then follow the formation of the dielectric layers.

Figure 9B:
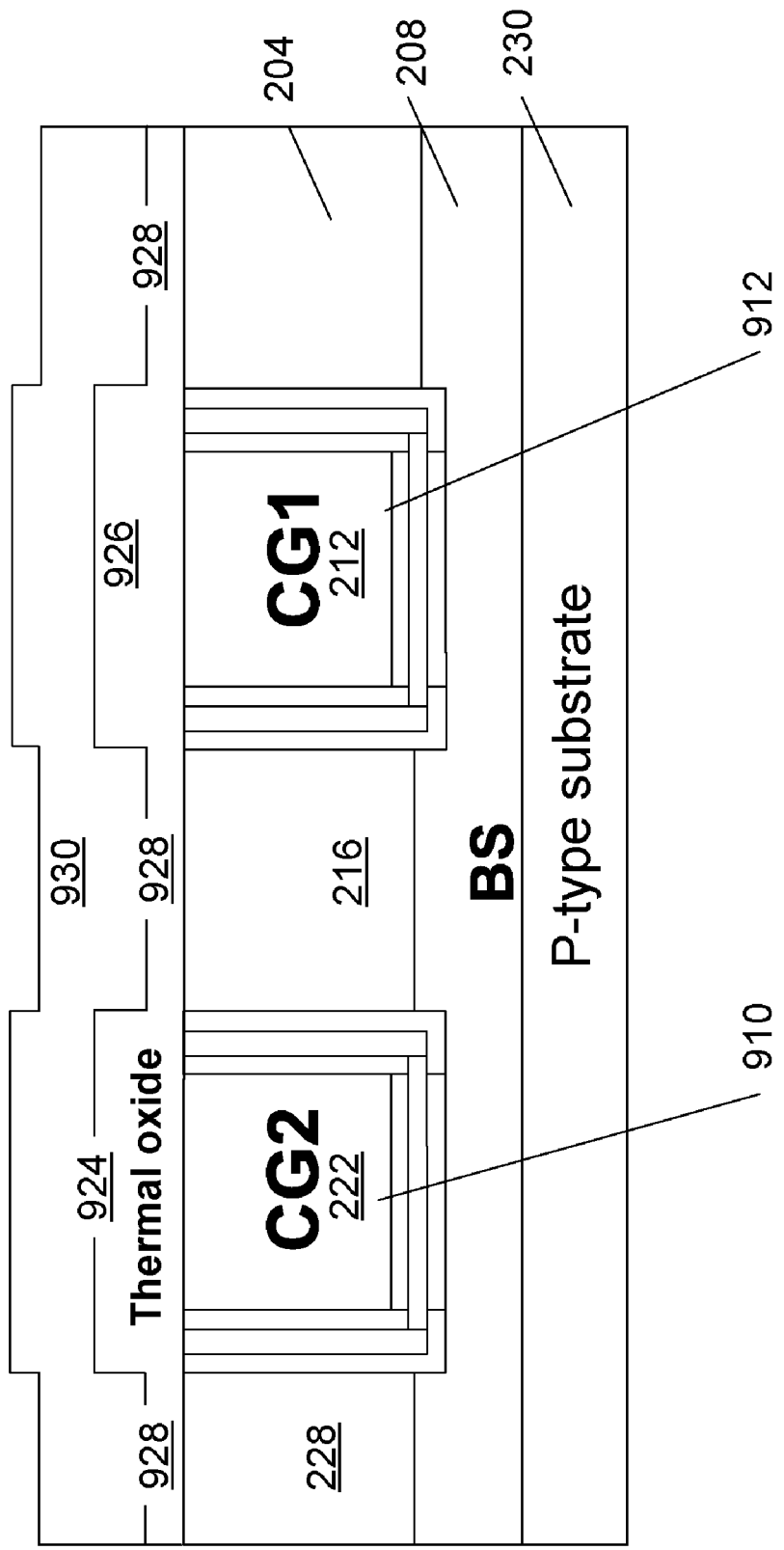

Now, referring to FIG. 9B, oxide layers 904 and silicon nitride layers 902 can be removed, e.g. using well-known techniques, and thermal oxidation can be used to form thermal oxide layers 924 and 926 over control gate polysilicon regions 222 and 212 respectively. This can be followed by the deposition of thin oxide layers 928 and thick silicon nitride layer 930, which can be used to form a mask for blanket P+ isolation implantation of body regions 204, 216, and 228.

Figure 9C:
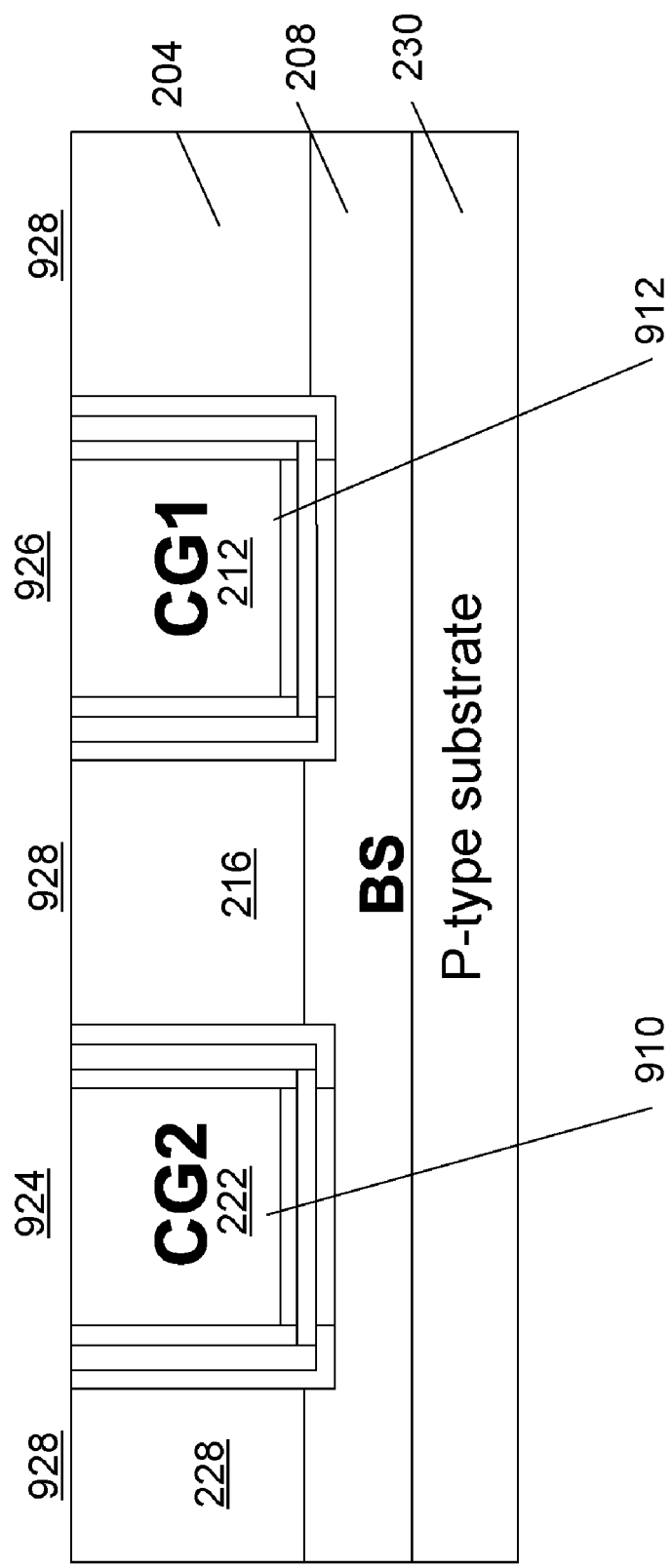

Now referring to FIG. 9C, after implantation to form the P+ isolation regions 204, 206, and 228, HDP oxide can be deposited over the P+ isolation regions and thick silicon nitride layer 930 can be removed.

Figure 9D:
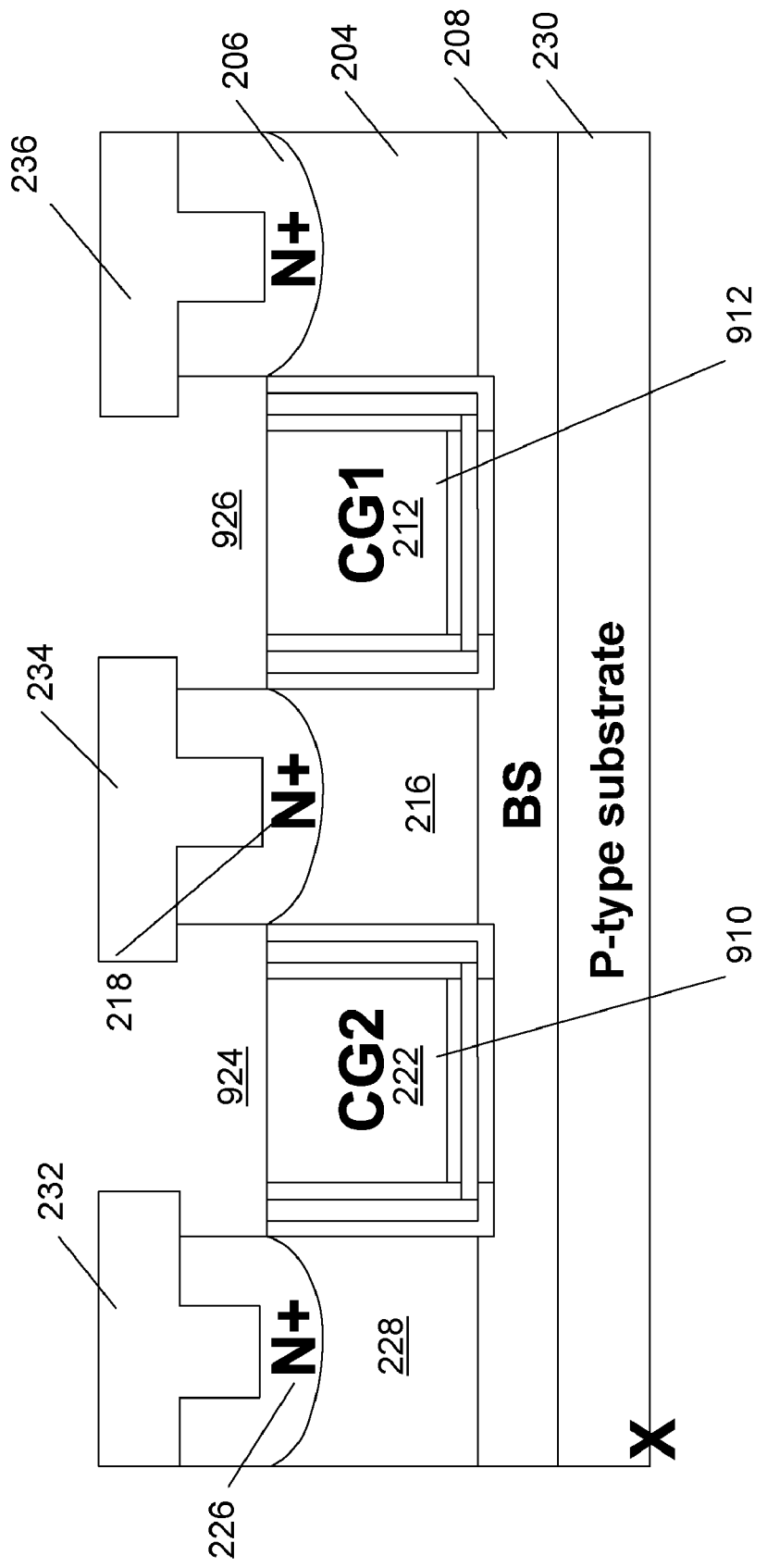

Referring to FIG. 9D, the silicon nitride can be removed for cell threshold (P−) implantation and shallow n+drain implantation. This can be followed by ILD deposition and a conventional photolithography and etching process to define a mask for metal contacts 232, 234, and 236. Metal contacts 232, 234 and 236 can then be deposited based on the mask defined.

It should be noted that storage layer 914 can actually be formed from polysilicon, silicon nitride, as in the examples illustrated here, or Al2O3, HfO2, CeO2 or any other high −K material. Further, the systems and methods described herein allow for higher read or programmed currents by enabling a longer channel length within body regions 204, 216 and 228. Minimum cell size can also be achieved due to the ability to scale the width of gate regions 212 and 222 in order to achieve a desired compactness and/or density. It should also be noted that memory array 201 and 202 comprises physical 4-bits cells using a single poly process and that no isolation structures are required between cells with an array 200. As a result, smaller and/or higher density memory erase can be achieved.

The density achieved from memory cell 200 can be further increased using MLC techniques. For example, a 4-bit per cell structures described above can be converted into 16-bit per cell structures using multi-level charged techniques. MLC techniques take advantage of the fact that a flash cell is an analog storage device as opposed to a digital storage device. In other words, a flash memory cell stores charge not bits. By using a controlled programming technique, it is possible to place a precise amount of charge on the floating gate, e.g., in storage layer 914. By accurately placing charges to, e.g., one of four charged states, or ranges, a single transistor structure can be set to store a plurality of bits. For example, each of the four charged states are then associated with a 2-bit data pattern. This can be illustrated with the aid of FIG. 10.

Figure 10:
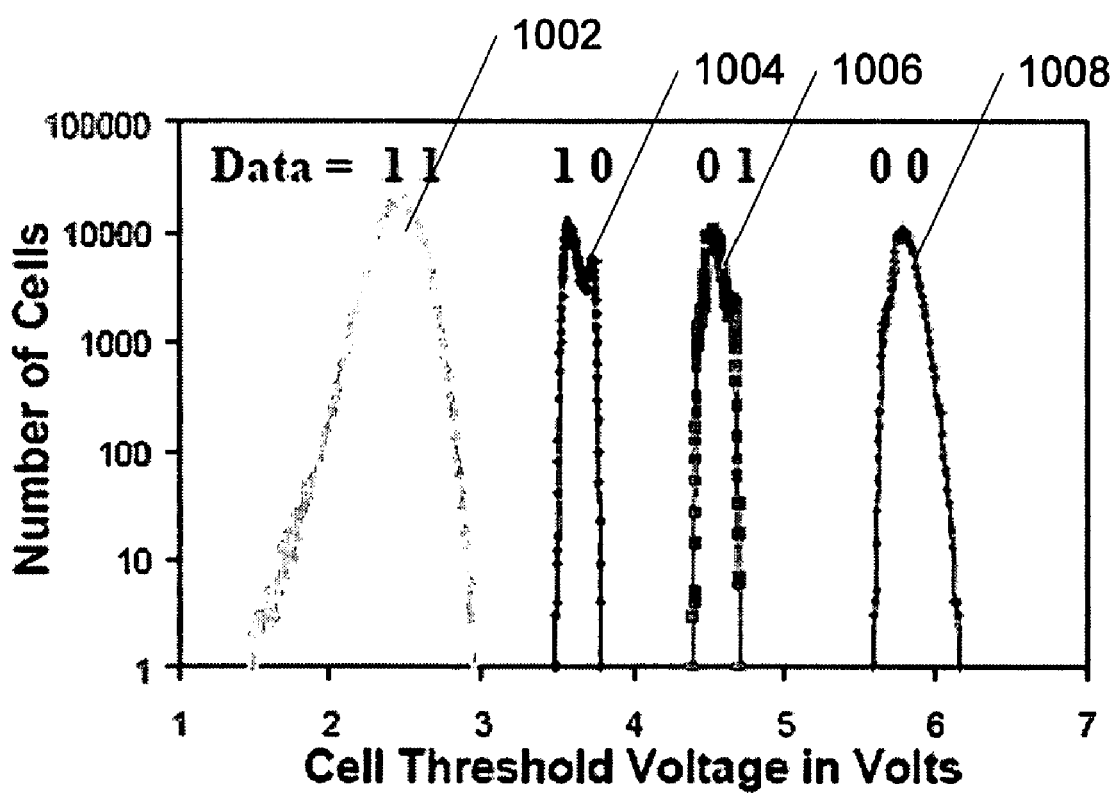
FIG. 10 is a diagram illustrating an example multi-level charge technique that can be used with the array of FIG. 2.

FIG. 10 illustrates the threshold voltage distributions for a MLC transistor structure. The first distribution 1002 is associated with the erase state. After erasure, the cell can also be programmed to one of three programming states represented by the threshold distributions 1004, 1006, and 1008 respectively. Each state represented by distributions 1002, 1004, 1006, and 1008 can then be mapped to a 2-bit data pattern. For example, the state associated with distribution 1002 can be mapped to data pattern 11, the state associated with distribution 1004 can be mapped to data pattern 10, the state associated with distribution 1006 can be mapped to data pattern 01, and the state associated with distribution 1008 can be mapped to data pattern 00.

Thus, by using MLC techniques, the bits per cell for memory array 200 can be increased in order to further increase the density of memory array 200. When MLC techniques are combined with vertical transistor structures and the elimination of isolation layers between cells, it is possible to achieve extremely high-density memory arrays that have very good performance, e.g. due to low transistor junction capacitance.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A method for fabricating a vertical memory array, comprising:
    providing a substrate;
    forming a common source line;
    forming a first trench in the substrate;
    forming a second trench in the substrate;
    performing an ion implantation into the substrate to form a joint drain region between the first and second trenches;
    forming a first charge trapping structure over the substrate and the first trench;
    forming a second charge trapping structure over the substrate and the second trench; and
    forming polysilicon gate layers within the first and second trenches,
    wherein the polysilicon gate layers within the first and second trenches comprise control gates in contact with portions of the first and second charge trapping structures that are formed over a bottom portion of the first and second trenches, and
    wherein the common source line continuously extends below the first and second trenches.

2. The method of claim 1, wherein at least one of the first and second charge trapping structures includes a first dielectric layer, a charge trapping layer, a second dielectric layer.

3. The method of claim 1, wherein the forming of at least one of the first and second charge trapping structures comprises forming a layer comprising at least one of nitride, Al2O3, HfO2, or CeO2.

4. The method of claim 1, wherein the forming of at least one of the first and second charge trapping structures comprises forming a layer comprising high-dielectric constant material.

5. The method of claim 1, wherein the forming of the common source line comprises performing ion implantation to form the common source line.

6. The method of claim 1, further comprising performing ion implantation to form a joint body region between the first and second trenches.

7. The method of claim 1, further comprising performing ion implantation into the substrate to form a drain region on the outside of each of the first and second trenches.

8. The method of claim 7, further comprising performing ion implantation to form body regions on the outside of the first trench and on the outside of the second trench.

9. The method of claim 1, further comprising configuring a depth of first and second channels to achieve a desired channel length.

10. The method of claim 9, wherein the desired channel length is selected to achieve a desired read or program current.

11. The method of claim 1, further comprising configuring a width of the first and second trenches to achieve a desired gate width.

12. The method of claim 11, wherein the desired gate width is selected to achieve a desired cell size.

13. The method of claim 1, storing four separate bits, two in each of the first and second charge trapping structures.

14. The method of claim 1, wherein each of the first and second trenches comprises a single gate structure.

* * * * *